(12) United States Patent
Jeon

(10) Patent No.: US 7,601,633 B2
(45) Date of Patent: Oct. 13, 2009

(54) SEMICONDUCTOR DEVICE AND METHOD FOR FABRICATING THE SAME

(75) Inventor: Dong Ki Jeon, Icheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 57 days.

(21) Appl. No.: 11/924,387

(22) Filed: Oct. 25, 2007

(65) Prior Publication Data

US 2008/0111240 A1     May 15, 2008

(30) Foreign Application Priority Data

Nov. 13, 2006    (KR)  ............ 10-2006-0111448

(51) Int. Cl.
*H01L 21/4763*      (2006.01)

(52) U.S. Cl. ............... 438/627; 438/643; 438/653; 257/741; 257/751; 257/E23.165

(58) Field of Classification Search ............ 438/99, 438/197, 597, 618, 621, 622, 625, 629, 637, 438/639, 652, 627, 643, 653; 257/741, 751, 257/E23.165

See application file for complete search history.

(56) References Cited

U.S. PATENT DOCUMENTS

| | | | |
|---|---|---|---|
| 6,762,849 B1 * | 7/2004 | Rulkens | 356/630 |
| 7,135,773 B2 * | 11/2006 | Furukawa et al. | 257/758 |
| 7,439,081 B2 * | 10/2008 | Furukawa et al. | 438/1 |
| 7,465,639 B1 * | 12/2008 | Pelella et al. | 438/384 |
| 7,473,950 B2 * | 1/2009 | Fournier | 257/295 |
| 2007/0122621 A1 * | 5/2007 | Kreupl et al. | 428/408 |

* cited by examiner

*Primary Examiner*—Zandra Smith
*Assistant Examiner*—Christy L Novacek
(74) *Attorney, Agent, or Firm*—Saliwanchik, Lloyd & Saliwanchik

(57) ABSTRACT

A semiconductor device and fabricating method thereof are provided. A carbon interconnection line can be formed on an interlayer insulating layer such that the carbon interconnection line is electrically connected to a conductive metal layer disposed in a contact hole of the semiconductor device.

18 Claims, 4 Drawing Sheets

SEMICONDUCTOR DEVICE AND METHOD FOR FABRICATING THE SAME

CROSS-REFERENCE TO RELATED APPLICATION

The present application claims the benefit under 35 U.S.C. §119 of Korean Patent Application No. 10-2006-0111448, filed Nov. 13, 2006, which is hereby incorporated by reference in its entirety.

BACKGROUND

As semiconductor devices become faster and more highly integrated, the size of transistors continue to become smaller. When transistors become more integrated, a line of a semiconductor device becomes finer, leading to signals applied to the line typically being delayed or distorted. Thus, the operation speed of a semiconductor device is hindered.

Consequently, lines using copper are often used. Copper lines have lower resistance and higher electro-migration than lines formed of aluminum or an aluminum alloy. However, because copper is more expensive than aluminum, the fabrication cost increases when copper is used instead of aluminum. Also, regions of a semiconductor device adjacent to a copper interconnection line are often contaminated due to the migration of free copper electrons.

Thus, there exists a need in the art for an improved semiconductor device and fabrication method thereof.

BRIEF SUMMARY

Embodiments of the present invention provide a semiconductor device and a method for fabricating the semiconductor device where an interconnection is formed using carbon.

In an embodiment, a method for fabricating a semiconductor device can include: forming a first interlayer insulating layer on a substrate; forming a contact hole in the first interlayer insulating layer; forming a conductive metal layer on the first interlayer insulating layer and in the contact hole; removing a portion of the conductive metal layer to expose a surface of the first interlayer insulating layer; forming a carbon layer on the first interlayer insulating layer and the conductive metal layer; and processing the carbon layer to form at least one carbon interconnection line.

A semiconductor device according to an embodiment can include a semiconductor substrate having a source/drain region and a gate electrode and a first interlayer insulating layer pattern having a contact hole. A conductive metal layer can be in the contact hole, and a carbon interconnection line can be on the first interlayer insulating layer and electrically connected to the conductive metal layer.

The details of one or more embodiments are set forth in the accompanying drawings and detailed description. Other features will be apparent to one skilled in the art from the detailed description, the drawings, and the appended claims.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

A source/drain region and a gate electrode can be formed on a semiconductor substrate. The semiconductor substrate can be any substrate known in the art, for example, a monocrystalline silicon substrate. The semiconductor substrate can be doped with P-type impurities or N-type impurities. Impurities, such as P-type impurities or N-type impurities, can be implanted into the semiconductor substrate through a typical implantation process known in the art to form the source/drain region. A gate electrode can also be formed through a typical process known in the art.

Figure 1:
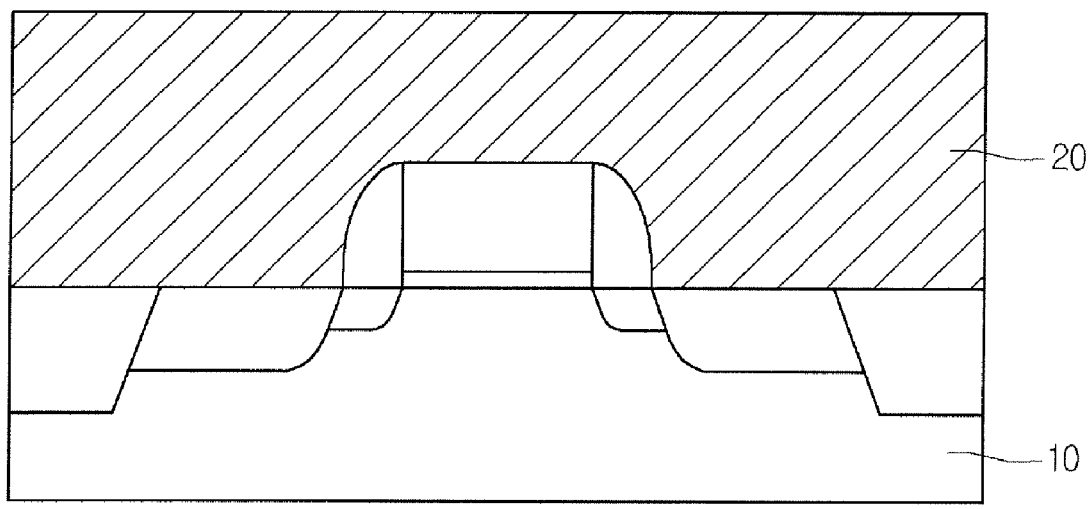
FIGS. 1 to 6 are cross-sectional views illustrating a method for fabricating a semiconductor device according to an embodiment of the present invention.

Referring to FIG. 1, a first interlayer insulating layer 20 can be formed on the semiconductor substrate 10. The first interlayer insulating layer 20 can be formed of any suitable material known in the art, for example, tetraethyl orthosilicate (TEOS).

Figure 2:
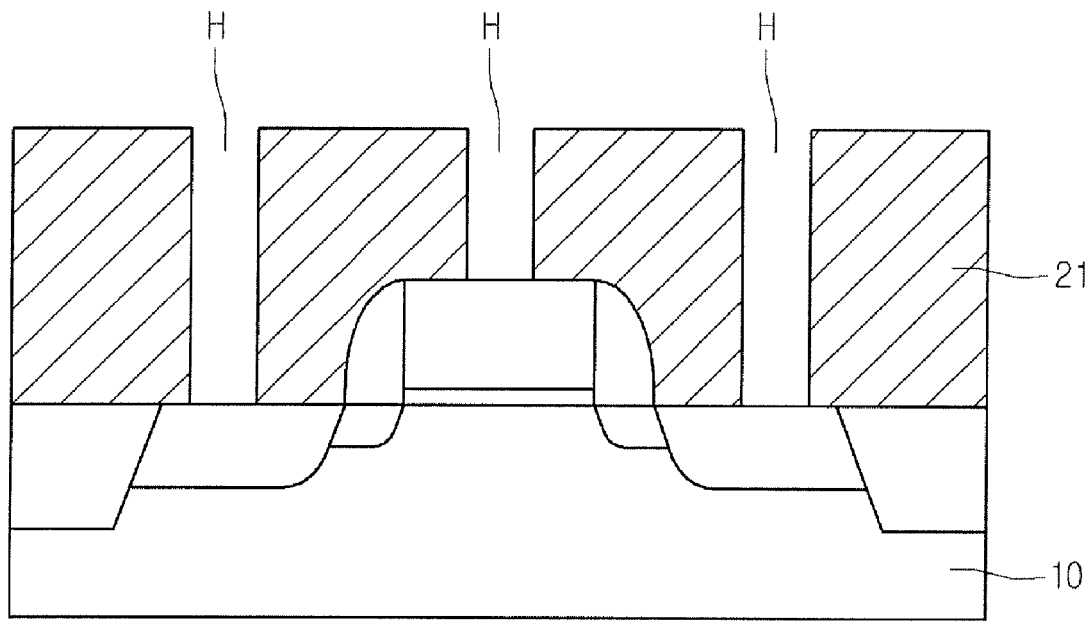

Referring to FIG. 2, a photoresist layer (not shown) can be deposited on the first interlayer insulating layer 20. A photoresist pattern can be scale-down projected and exposed on the photoresist layer. An exposure device, such as a stepper, can be used to scale-down project and expose the photoresist pattern. The resulting structure can be developed to form a photoresist pattern (not shown). Then, the first interlayer insulating layer can be etched using the photoresist pattern as an etching mask to form a first interlayer insulating layer pattern 21 having at least one contact hole H penetrating the first interlayer insulating layer. For example, the first interlayer insulating layer can be etched through a reactive ion etching (RIE) process.

Figure 3:
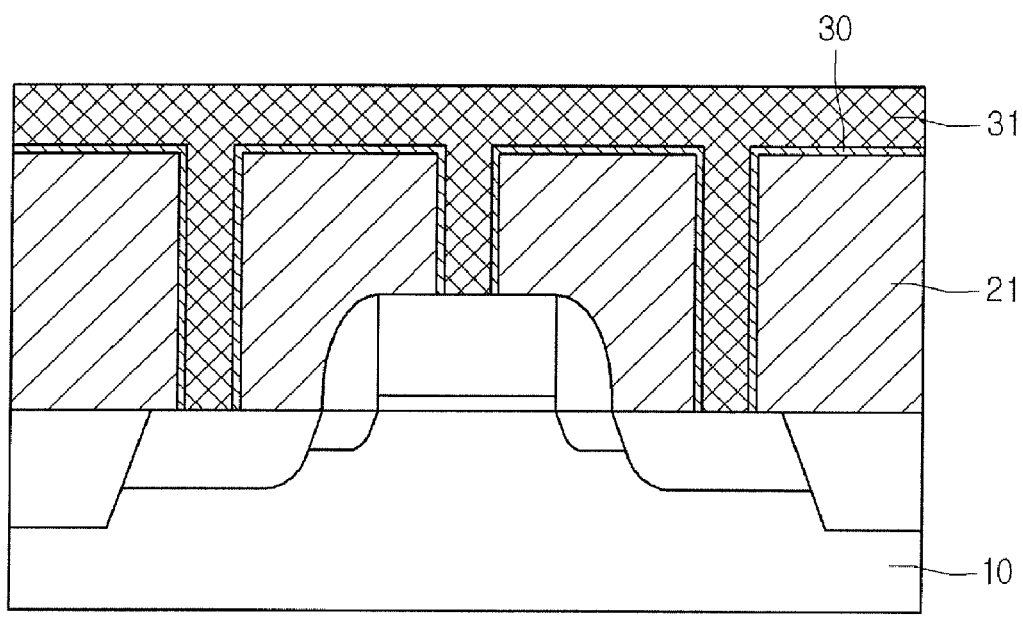

Referring to FIG. 3, a barrier metal layer 30 can be deposited on the first interlayer insulating layer pattern 21 and in the contact holes H. The barrier metal layer 30 can be deposited using any suitable method known in the art. A conductive metal layer 31 can be formed (filled) on the deposited barrier metal layer 30. The conductive metal layer can be formed of tungsten (W) or any other suitable material known in the art. The conductive metal layer 31 can be deposited using, for example, chemical vapor deposition (CVD) or any other appropriate method known in the art.

Figure 4:
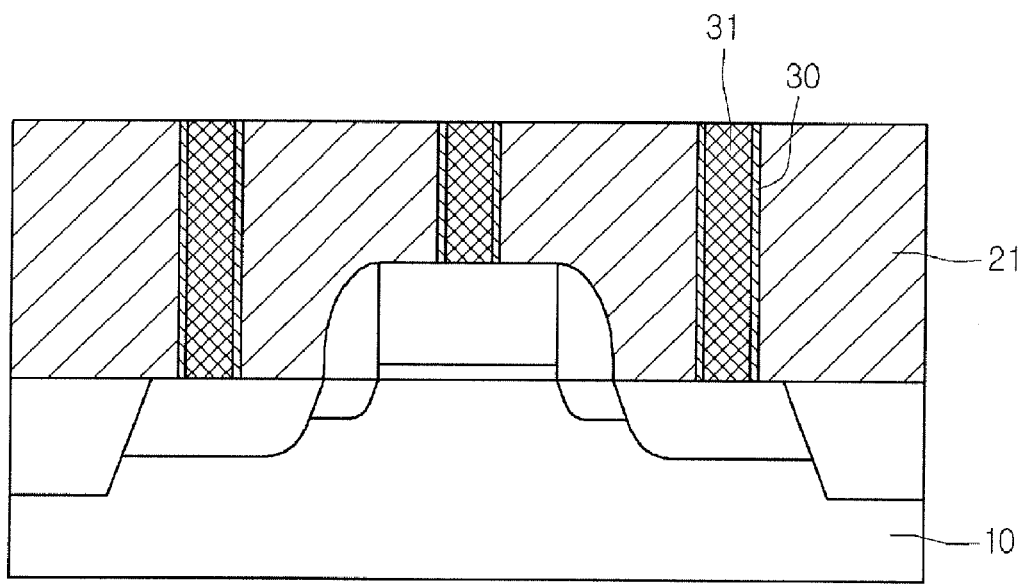

Referring to FIG. 4, a process can be performed to remove at least a portion of the conductive metal layer 31 and the barrier metal layer 30 to expose the upper surface of the first interlayer insulating layer pattern 21. The process to remove at least a portion of the conductive metal layer 31 and the barrier metal layer 30 can be, for example, a chemical mechanical polishing (CMP) process to polish the conductive metal layer 31 and the barrier metal layer 30.

Figure 5:
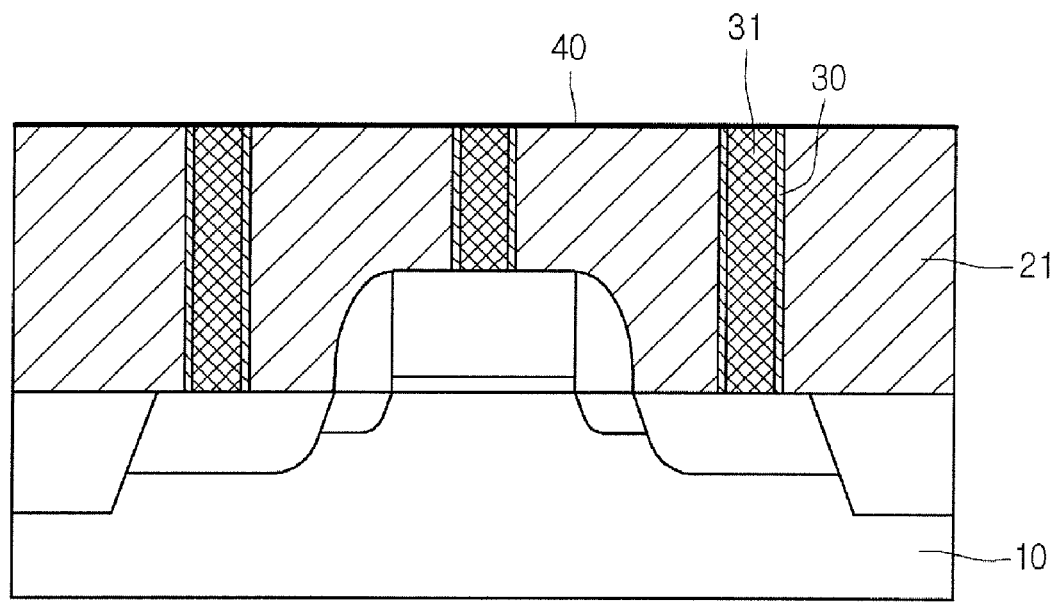

Referring to FIG. 5, a first carbon nitride layer 40 can be deposited on the first interlayer insulating layer pattern 21, the polished conductive metal layer 31, and the polished barrier metal layer 30. In an embodiment, the first carbon nitride layer 40 can be $C_xN_y$, where x and y are integers.

In an embodiment, the first carbon nitride layer 40 can be formed to a thickness of about 100 Å to about 200 Å. The first carbon nitride layer 40 can be formed using any suitable method known in the art, such as a physical vapor deposition (PVD) process. For example, the first carbon nitride layer 40 can be formed by performing a direct current (DC) magnetron sputtering process in a PVD chamber. Argon (Ar) and nitrogen ($N_2$) gas can be used as sputtering gas for the DC magnetron sputtering process. In an embodiment, the DC magnetron sputtering process can be performed under an atmosphere of argon and nitrogen gas with a flow rate of about 55 standard cubic centimeters per minute (sccm) and a DC power of about 0 W for a time period of about 10 seconds to about 15 seconds. In a further embodiment, a second DC magnetron sputtering process can be performed in the PVD chamber under an atmosphere of heated argon (ArH) and nitrogen gas with a flow rate of about 55 sccm and a DC power of about 3,000 W to about 10,000 W for a time period of about 10 seconds to about 900 seconds.

Figure 6:
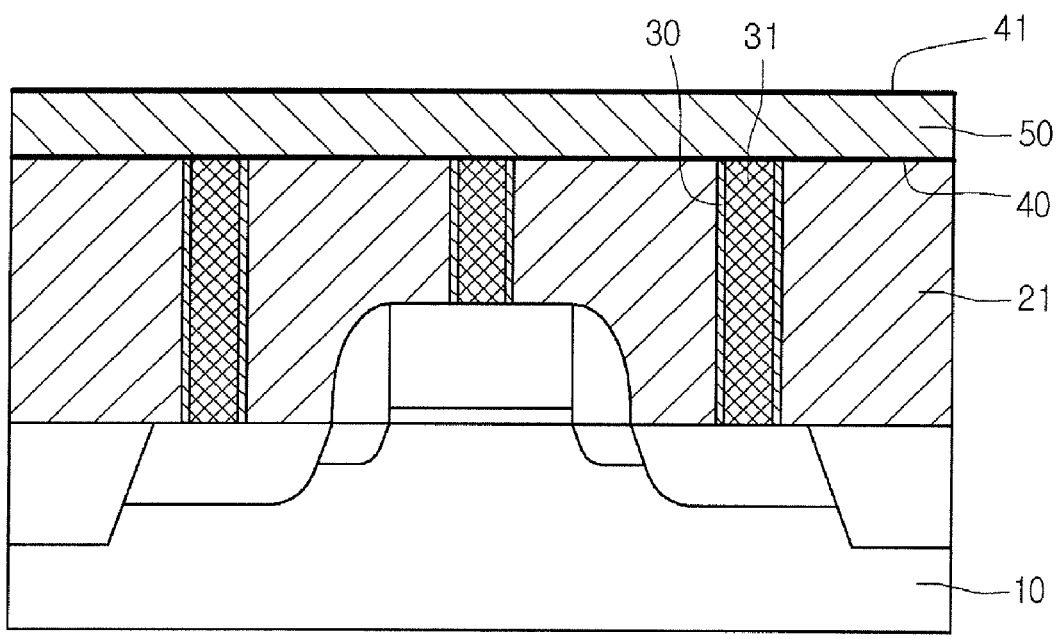

Referring to FIG. 6, a carbon layer 50 can be formed on the first carbon nitride layer 40. The carbon layer 50 can be formed using, for example, a PVD process. In an embodiment, the carbon layer 50 can formed by performing a PVD process under an atmosphere of argon (Ar) gas with a flow rate of about 15 sccm and a DC power of about 0 W for a time period of about 10 seconds to about 15 seconds. Ar gas can be used as sputtering gas, and pure carbon can be used as a sputtering source material during the PVD process. In a further embodiment, a second PVD process can be performed under an atmosphere of heated argon (ArH) with a flow rate of about 15 sccm and a DC power of about 500 W to about 10,000 W for a time period of about 10 seconds to about 900 seconds. For example, the carbon layer can be formed to a thickness of from about 2,300 Å to about 2,700 Å.

A second carbon nitride layer 41 can be formed on the carbon layer 50. In an embodiment, the second carbon nitride layer 41 can be formed to a thickness of about 300 Å to about 700 Å. The second carbon nitride layer 41 can be formed using any suitable method known in the art, such as a physical vapor deposition (PVD) process. For example, the first carbon nitride layer 40 can be formed by performing a direct current (DC) magnetron sputtering process in a PVD chamber. Argon (Ar) and nitrogen (N₂) gas can be used as sputtering gas for the DC magnetron sputtering process. In an embodiment, the DC magnetron sputtering process can be performed under an atmosphere of argon and nitrogen gas with a DC power of about 0 W. In a further embodiment, a second DC magnetron sputtering process can be performed in the PVD chamber under an atmosphere of heated argon (ArH) and nitrogen gas with a DC power of about 3,000 W to about 10,000 W. The flow rates and time periods of both DC magnetron sputtering processes can be chosen to give a desired thickness of the second carbon nitride layer 41, as will be apparent to one skilled in the art.

Figure 7:
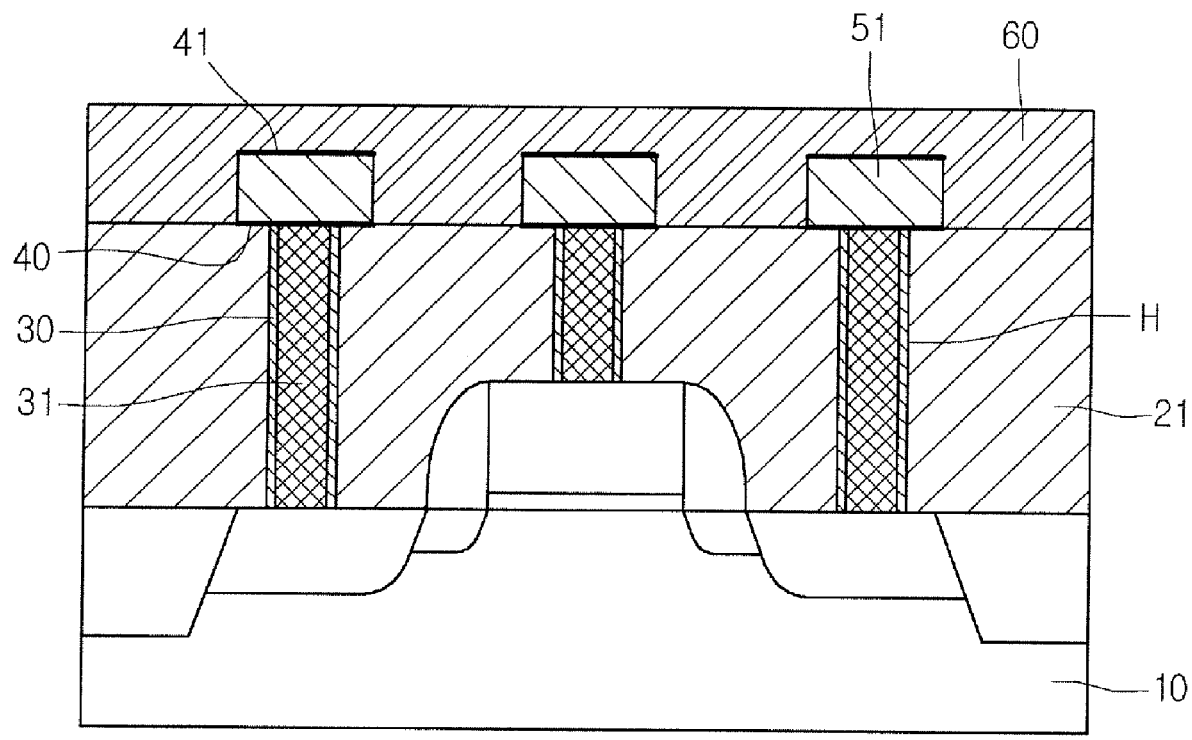
FIG. 7 is a cross-sectional view of a semiconductor device according to an embodiment of the present invention.

Referring to FIG. 7, the carbon layer 50 can be patterned and etched through any suitable process known in the art to form at least one carbon interconnection line 51. Then, a second interlayer insulating layer 60 can be deposited on the first interlayer insulating layer pattern 21 and the carbon interconnection lines 51.

As shown in FIG. 7, in an embodiment, a source/drain region and a gate electrode can be disposed on a semiconductor substrate 10. A first interlayer insulating layer pattern 21 can be disposed on the resulting structure, and at least one contact hole H can be disposed in the first interlayer insulating layer pattern 21.

A barrier metal layer 30 and a conductive metal layer 31 can be disposed in the contact holes H. At least one carbon interconnection line 51 can be disposed on the first interlayer insulating layer pattern 21 such that the carbon interconnection line 51 is electrically connected to the conductive metal layer 31.

A first carbon nitride layer 40 can be disposed on a bottom surface of the carbon interconnection lines 51, and a second carbon nitride layer 41 can be disposed on the carbon interconnection lines 51. In an embodiment, the carbon interconnection lines 51 can be about 8 to about 12 times thicker than the first carbon nitride layer 40, and the second carbon nitride layer 41 can be about 1.5 times to about 3 times thicker than the first carbon nitride layer 40.

In an embodiment, the first carbon nitride layer 40 can have a thickness of between about 100 Å and about 200 Å, the carbon interconnection lines 51 can each have a thickness of between about 2,300 Å and about 2,700 Å, and the second carbon nitride layer 41 can have a thickness of between about 300 Å and about 700 Å.

A second interlayer insulating layer 60 can be disposed on the carbon interconnection line 51.

The first carbon nitride layer 40 and the second carbon nitride layer 41 can inhibit carbon from the carbon interconnection line 51 from diffusing into the first interlayer insulating layer pattern 21 or the second interlayer insulating layer 60. Also, the first and second carbon nitride layers 40 and 41 can each serve as an anti-reflection coating (ARC) during a patterning process.

According to embodiments of the present invention, the reliability of a semiconductor device can be enhanced since the use of carbon can reduce electro-migration and stress migration. Also, fabrication cost can be reduced because carbon is less expensive than aluminum and copper. Furthermore, in an embodiment, fabrication process time can be reduced and production can be enhanced because a carbon layer and a carbon nitride layer (i.e., a diffusion barrier of the carbon layer) can be deposited using one PVD chamber. Moreover, because carbon has a high melting temperature, higher temperatures can be used in subsequent processes on a semiconductor device after the deposition of the carbon layer. Accordingly, a semiconductor device can be provided that can operate at high temperatures.

Any reference in this specification to "one embodiment," "an embodiment," "example embodiment," etc., means that a particular feature structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a semiconductor device, comprising:
   forming a first interlayer insulating layer on a substrate;
   forming a contact hole in the first interlayer insulating layer;

forming a conductive metal layer on the first interlayer insulating layer and in the contact hole;
removing a portion of the conductive metal layer to expose an upper surface of the first interlayer insulating layer;
forming a carbon layer on the first interlayer insulating layer and the conductive metal layer;
processing the carbon layer to form at least one carbon interconnection line;
forming a first carbon nitride ($C_xN_y$) layer on the first interlayer insulating layer and the conductive metal layer before forming the carbon layer; and
forming a second carbon nitride layer ($C_xN_y$) on the carbon layer.

2. The method according to claim 1, further comprising forming a second interlayer insulating layer on the first interlayer insulating layer and the at least one carbon interconnection line.

3. The method according to claim 1, wherein forming the contact hole comprises pattering and etching the first interlayer insulating layer.

4. The method according to claim 1, wherein the conductive metal layer comprises tungsten.

5. The method according to claim 1, wherein forming the conductive metal layer comprises performing a chemical vapor deposition (CVD) process.

6. The method according to claim 1, further comprising forming a barrier metal layer on the first interlayer insulating layer and in the contact hole before forming the conductive metal layer.

7. The method according to claim 1, wherein removing a portion of the conductive metal layer comprises performing a chemical mechanical polishing (CMP) process.

8. The method according to claim 1, wherein the carbon layer has a thickness of between about 2,300 Å and about 2,700 Å.

9. The method according to claim 1, wherein the first carbon nitride layer has a thickness of between about 100 Å and about 200 Å.

10. The method according to claim 1 wherein the second carbon nitride layer has a thickness of between about 300 Å and about 700 Å.

11. The method according to claim 1, wherein the first carbon nitride layer, the second carbon nitride layer, and the carbon layer are formed in the same chamber.

12. The method according to claim 1, wherein processing the carbon layer to form at least one carbon interconnection line comprises pattering and etching the carbon layer.

13. The method according to claim 1, wherein forming the carbon layer comprises:
performing a first direct current (DC) magnetron sputtering process in a physical vapor deposition (PVD) chamber using argon (Ar) gas and pure carbon under an atmosphere of an Ar gas with a flow rate of about 15 sccm and a DC power of about 0 W for a time period of about 10 seconds to about 15 seconds; and
performing a second DC magnetron sputtering process in the PVD chamber under an atmosphere of a heated argon (ArH) gas with a flow rate of about 15 sccm and a DC power of about 500 W to about 10000 W for a time period of about 10 seconds to about 900 seconds.

14. A semiconductor device, comprising:
a first interlayer insulating layer pattern including a contact hole;
a conductive metal layer in the contact hole; and
a carbon interconnection line on the first interlayer insulating layer pattern and electrically connected to the conductive metal layer;
a first carbon nitride layer disposed on a bottom surface of the carbon interconnection line; and
a second carbon nitride layer disposed on the carbon interconnection line;
wherein the first carbon nitride layer comprises $C_xN_y$, and wherein the second carbon nitride layer comprises $C_xN_y$, where x and y are integers.

15. The semiconductor device according to claim 14, further comprising a second interlayer insulating layer on the first interlayer insulating layer and the carbon interconnection line.

16. The semiconductor device according to claim 14, further comprising a barrier metal layer in the contact hole.

17. The semiconductor device according to claim 14, wherein the first carbon nitride layer has a thickness of between about 100 Å and about 200 Å, and wherein the carbon interconnection line has a thickness of between about 2,300 Å and about 2,700 Å, and wherein the second carbon nitride layer has a thickness of between about 300 Å and about 700 Å.

18. A method for fabricating a semiconductor device, comprising forming a carbon interconnection line on an interlayer insulating layer, wherein the carbon interconnection line is electrically connected to a conductive metal layer in a contact hole; and wherein the carbon interconnection line comprises a carbon layer formed by physical vapor deposition.

* * * * *